(12) United States Patent
Hosey et al.

(10) Patent No.: US 8,924,193 B2
(45) Date of Patent: Dec. 30, 2014

(54) GENERATING VARIANTS FROM FILE DIFFERENCES

(71) Applicant: The MathWorks, Inc., Natick, MA (US)

(72) Inventors: Timothy Hosey, Longstanton (GB); Robert O. Aberg, South Grafton, MA (US); Ebrahim Mehran Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 36 days.

(21) Appl. No.: 13/828,312

(22) Filed: Mar. 14, 2013

(65) Prior Publication Data

US 2014/0278307 A1  Sep. 18, 2014

(51) Int. Cl.
*G06F 17/50* (2006.01)

(52) U.S. Cl.
CPC .................................. *G06F 17/5009* (2013.01)
USPC ................ 703/24; 703/22; 707/758; 707/802

(58) Field of Classification Search
CPC ....... G06F 17/50; G06F 9/447; G06F 11/362; G06F 17/5009; G06F 9/445
USPC ........... 703/2, 4, 22, 24; 707/8, 104, 758, 802
See application file for complete search history.

(56) References Cited

U.S. PATENT DOCUMENTS

| 8,140,497 B2 * | 3/2012 | Goodman et al. ............ 707/704 |
| 2008/0114937 A1 * | 5/2008 | Reid et al. ..................... 711/117 |
| 2009/0171962 A1 * | 7/2009 | Goodman et al. ................ 707/8 |

* cited by examiner

*Primary Examiner* — Thai Phan
(74) *Attorney, Agent, or Firm* — Harrity & Harrity, LLP

(57) ABSTRACT

A device receives model information associated with a modeling application. The device determines first and second conflicting information in the model information. The first and second conflicting information describe different characteristics of a model described by the model information. The device formats the first and second conflicting information in a manner that designates the first conflicting information as a first variant of the model and the second conflicting information as a second variant of the model. The model, when executed with the first variant, behaves in a different manner than when executed with the second variant. The device provides the formatted first and second conflicting information to the modeling application, provides information that identifies the first and second variant, receives a user selection of information that identifies the first variant or second variant, and executes the model based on the user selection.

20 Claims, 10 Drawing Sheets

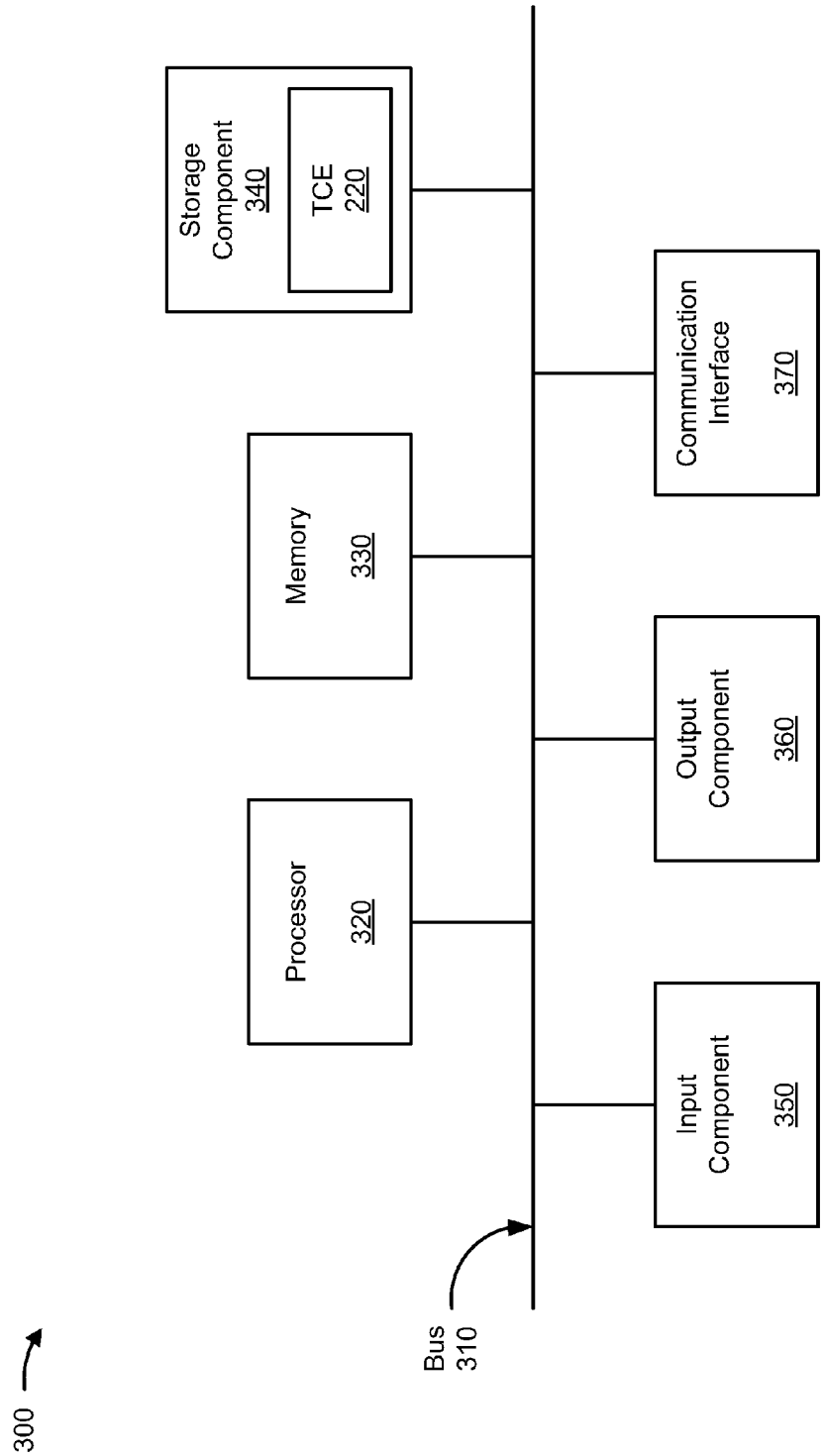

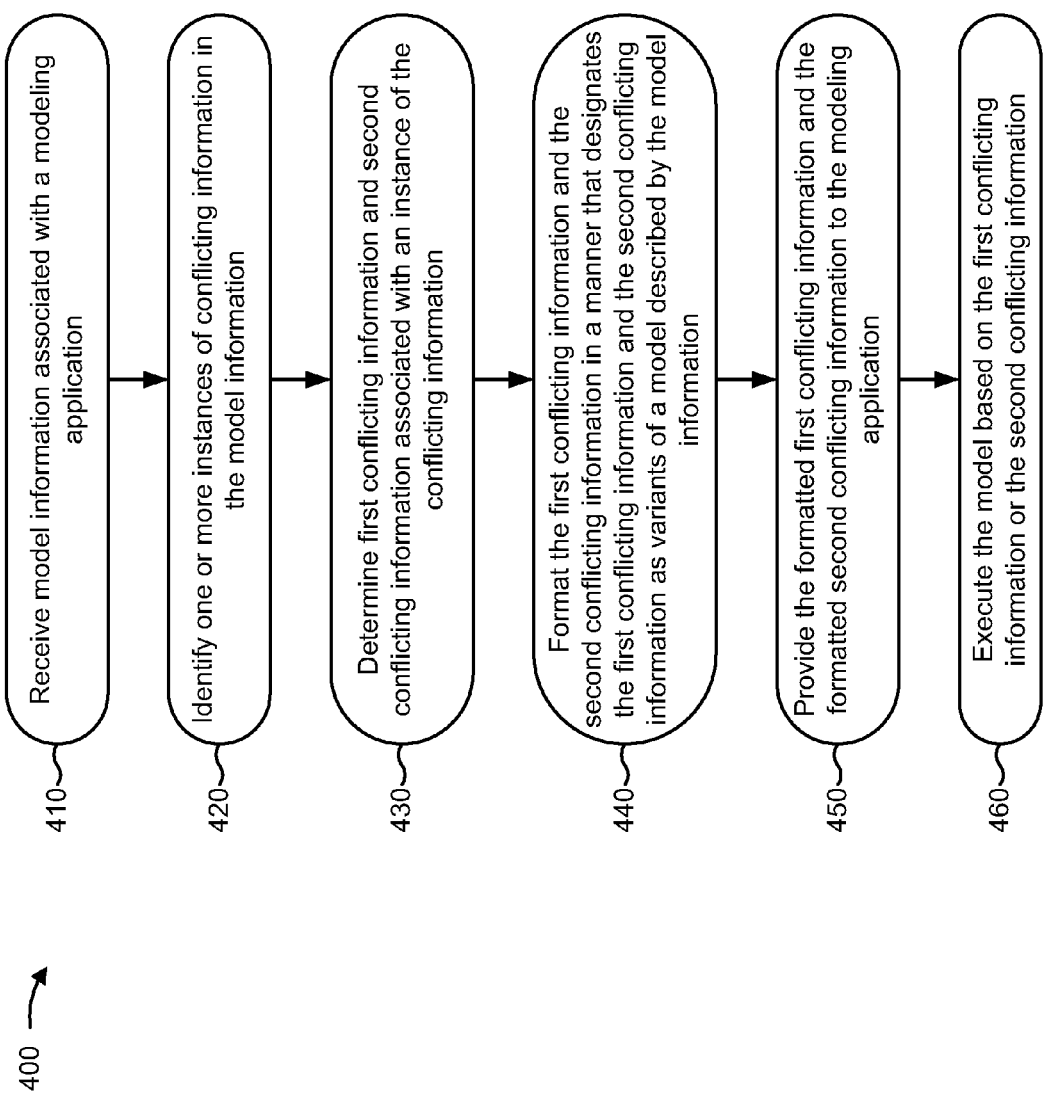

GENERATING VARIANTS FROM FILE DIFFERENCES

BRIEF DESCRIPTION OF THE DRAWINGS

FIG. 3 is a diagram of example components of one or more devices of FIG. 2;

FIG. 4 is a flow chart of an example process for generating model variants from file differences;

DETAILED DESCRIPTION

The following detailed description of example implementations refers to the accompanying drawings. The same reference numbers in different drawings may identify the same or similar elements.

An application may use application information, stored in an application file, to perform a particular task, such as executing a model that simulates behavior of a system, where the model or execution of the model is described by the application information. When a user edits the application information, previous application information stored in the application file may be replaced with the edited application information. When multiple users edit the application information, different application file versions may be generated that store the multiple edits to the application information.

Some users may not want previous application information to be replaced, or may not want to generate multiple application file versions. Instead, the users may want the multiple edits to the application information to act as alternatives, or variants, of an item described by the application information. For example, the users may want the multiple edits to be variants of a model. A variant, as used herein, may refer to an alternative structure (e.g., with alternative characteristics) for a particular item or element (e.g., a block of a block diagram model) described by the application information. Implementations described herein may allow users to easily generate variants from multiple edits or versions of application information.

Figure 1:
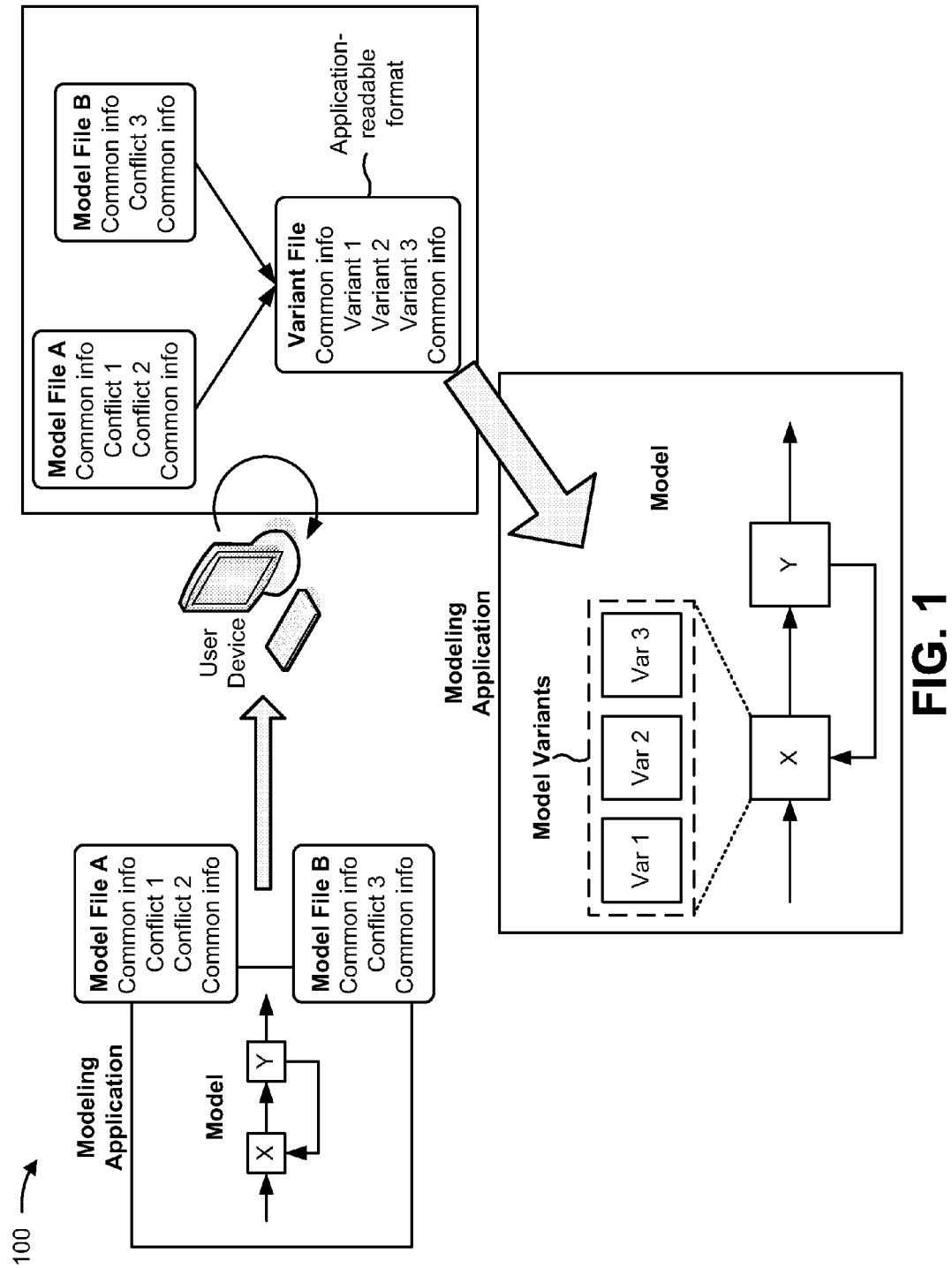
FIG. 1 is a diagram of an overview of an example implementation described herein.

FIG. 1 is a diagram of an overview of an example implementation 100 described herein. As shown in FIG. 1, a user device (e.g., a computer) may store a model, such as an executable model of a control system with components X and Y. A modeling application (e.g., a modeling environment running on the user device) may use model information to generate, process, and/or execute the model. The model information may identify, for example, an element of the model (e.g., a block in a block diagram model), a connection between elements of the model, a function performed by an element of the model, a parameter that affects a behavior of the model or a model element, and/or other information associated with the model. The model information may be stored in one or more model files, such as Model File A and Model File B, as shown.

The model files may include common information and/or conflicting information. Common information, as used herein, may refer to information that is common (e.g., the same) in two or more model files, two or more versions of a model file, two or more edits of a model file, etc. Conflicting information, as used herein, may refer to information that is not common (e.g., is not the same) in two or more model files, two or more versions of a model file, two or more edits of a model file, etc. As shown, Model File A may include conflicting information, labeled as conflict 1 and conflict 2, and Model File B may include conflicting information, labeled as conflict 3.

As further shown in FIG. 1, the user device may receive the model files, and may encode conflicting information in the model files (e.g., conflict 1, conflict 2, and conflict 3) in a variant file that includes information designating the conflicting information as variants of a model (e.g., variant 1, variant 2, and variant 3). The user device may arrange information in the variant file in an application-readable format so that the modeling application can read, process, and/or execute the information to, for example, display a variant and/or execute the model using a variant. As further shown, the user device may provide the variant file to the modeling application. The modeling application may provide a representation, via a user interface, of the variants (e.g., variant 1, variant 2, and variant 3) and an element of the model associated with the variants (e.g., element X). A user may select one of the variants, and the selected variant may describe a behavior of the associated element (e.g., element X) when the modeling application executes the model.

Figure 2:
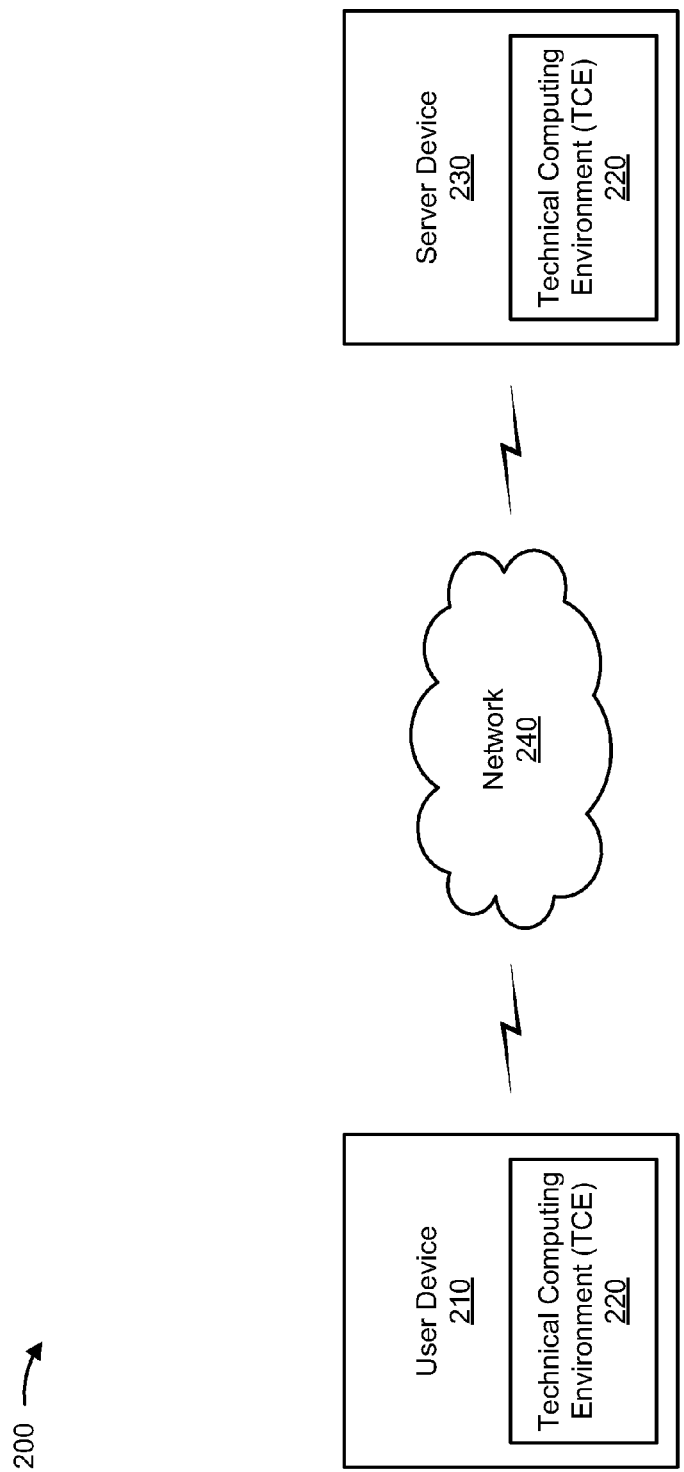
FIG. 2 is a diagram of an example environment in which systems and/or methods described herein may be implemented.

FIG. 2 is a diagram of an example environment 200 in which systems and/or methods described herein may be implemented. As shown in FIG. 2, environment 200 may include a user device 210, which may include a technical computing environment (TCE) 220. Furthermore, environment 200 may include a server device 230, which may include TCE 220, and a network 240. Devices of environment 200 may interconnect via wired connections, wireless connections, or a combination of wired and wireless connections.

User device 210 may include a device capable of receiving, generating, storing, processing, and/or providing information associated with a model, such as a model variant. For example, user device 210 may include a computing device (e.g., a desktop computer, a laptop computer, a tablet computer, a handheld computer, a server, etc.), a mobile phone (e.g., a smart phone, a radiotelephone, etc.), or a similar device. In some implementations, user device 210 may receive information from and/or transmit information to server device 230 (e.g., information associated with a model).

User device 210 may host TCE 220. TCE 220 may include any hardware-based logic or a combination of hardware and software-based logic that provides a computing environment that allows tasks to be performed (e.g., by users) related to disciplines, such as, but not limited to, mathematics, science, engineering, medicine, and business. TCE 220 may include a text-based environment (e.g., MATLAB® software), a graphically-based environment (e.g., Simulink® software, Stateflow® software, SimEvents® software, etc., by The MathWorks, Inc.; VisSim by Visual Solutions; LabView® by National Instruments; etc.), or another type of environment, such as a hybrid environment that may include, for example, a text-based environment and a graphically-based environment. In some implementations, TCE 220 may include a modeling application used to generate, process, and/or execute a model (e.g., a textual model and/or a graphical model, such as a block diagram model), such as a model of a physical system.

TCE 220 may include a modeling system that may be used in the creation of a functional model and that may enable generation of executable code based on the model. For example, TCE 220 may include a graphical modeling tool or application that provides a user interface for a numerical computing environment. Additionally, or alternatively, TCE 220 may include a graphical modeling tool and/or application that provides a user interface for modeling and simulating (e.g., by executing a model) a dynamic system (e.g., based on differential equations, difference equations, algebraic equations, discrete events, discrete states, stochastic relations, etc.). A dynamic system (either natural or man-made) may be a system whose response at any given time may be a function of its input stimuli, its current state, and a current time.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice. A block may be hierarchical in that the block itself may comprise one or more blocks that make up the block.

A graphical model (e.g., a functional model) may include entities with relationships between the entities, and the relationships and/or the entities may have attributes associated with them. The entities my include model elements, such as blocks and/or ports. The relationships may include model elements, such as lines (e.g., connector lines) and references. The attributes may include model elements, such as value information and meta information for the model element associated with the attributes. A graphical model may be associated with configuration information. The configuration information may include information for the graphical model, such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Server device 230 may include one or more devices capable of receiving, generating, storing, processing, and/or providing information associated with a model, such as a model variant. For example, server device 230 may include a computing device, such as a server, a desktop computer, a laptop computer, a tablet computer, a handheld computer, or a similar device. In some implementations, server device 230 may host TCE 220.

Network 240 may include one or more wired and/or wireless networks. For example, network 240 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks.

The number of devices and/or networks shown in FIG. 2 is provided as an example. In practice, there may be additional, fewer, different, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, one or more of the devices of environment 200 may perform one or more functions described as being performed by another one or more devices of environment 200.

FIG. 3 is a diagram of example components of a device 300, which may correspond to user device 210 and/or server device 230. In some implementations, each of user device 210 and/or server device 230 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a path that permits communication among the components of device 300. Processor 320 may include a processor (e.g., a central processing unit, a graphics processing unit, an accelerated processing unit, etc.), a microprocessor, and/or any processing logic (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage component (e.g., a flash, magnetic, or optical memory) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits a user to input information to device 300 (e.g., a touch screen display, a keyboard, a keypad, a mouse, a button, a switch, etc.). Output component 360 may include a component that outputs information from device 300 (e.g., a display, a speaker, one or more light-emitting diodes (LEDs), etc.).

Communication interface 370 may include a transceiver-like component, such as a transceiver and/or a separate receiver and transmitter, that enables device 300 to communicate with other devices, such as via a wired connection, a wireless connection, or a combination of wired and wireless connections. For example, communication interface 370 may include an Ethernet interface, an optical interface, a coaxial interface, an infrared interface, a radio frequency (RF) interface, a universal serial bus (USB) interface, or the like.

Device 300 may perform various operations described herein. Device 300 may perform these operations in response to processor 320 executing software instructions included in a computer-readable medium, such as memory 330 and/or storage component 340. A computer-readable medium may be defined as a non-transitory memory device. A memory device may include memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number of components shown in FIG. 3 is provided as an example. In practice, device 300 may include additional, fewer, different, or differently arranged components than those shown in FIG. 3. Additionally, or alternatively, one or more components of device 300 may perform one or more functions described as being performed by another one or more components of device 300.

FIG. 4 is a flow chart of an example process 400 for generating model variants from file differences. In some implementations, one or more process blocks of FIG. 4 may be performed by user device 210. In some implementations, one or more process blocks of FIG. 4 may be performed by another device or a group of devices separate from or including user device 210, such as server device 230.

As shown in FIG. 4, process 400 may include receiving model information associated with a modeling application (block 410). For example, user device 210 may receive the model information, which may be associated with a modeling application, such as TCE 220. The modeling application may use the model information to generate, process, and/or execute the model. The model information may identify, for example, a model element (e.g., a block in a block diagram model), a connection between model elements, a function performed by a model element, a parameter, condition, or characteristic that affects a behavior of the model or a model element (e.g., a high fidelity subsystem that runs slowly, a low fidelity subsystem that runs quickly, etc.), a state transition diagram associated with a model, a class hierarchy diagram associated with a model, an object diagram associated with a model, an activity diagram associated with a model, an equation, variable, function, etc. associated with a model, and/or other information associated with the model.

In some implementations, the model information may be arranged in a format that permits the modeling application to read, process, and/or execute the model information. For example, the model information may include information arranged using a data structure, a markup language (e.g., extensible markup language (XML), hypertext markup language (HTML), extensible hypertext markup language (XHTML), etc.), a file format, a hierarchical format, or another type of format. In some implementations, the model information may include program code. Additionally, or alternatively, a first portion of model information may be arranged in a format that permits the modeling application to read, process, and/or execute the first portion of model information. A second portion of model information may not be arranged in a format that permits the modeling application to read, process, and/or execute the second portion of model information. For example, the second portion may include one or more conflict markers, as described elsewhere herein.

Additionally, or alternatively, the model information may be stored in one or more files, which may be referred to herein as model files. In some implementations, the model files may be executable. The model information may include common information and/or conflicting information. Common information, as used herein, may refer to information that is common to (e.g., the same in) multiple versions of the model information, multiple edits to the model information, multiple model files, multiple versions of a model file, multiple edits to a model file, etc. Conflicting information, as used herein, may refer to information that is not common to (e.g., not the same in) multiple versions of the model information, multiple edits to the model information, multiple model files, multiple versions of a model file, multiple edits to a model file, etc. In some implementations, the common information and/or the conflicting information may represent a portion of the model information.

In some implementations, the model information may include serialized information, which may be received in an information stream (e.g., from another device). For example, user device 210 may receive a stream of model information from server device 230.

As further shown in FIG. 4, process 400 may include identifying one or more instances of conflicting information in the model information (block 420), and determining first conflicting information and second conflicting information associated with an instance of the conflicting information (block 430). For example, user device 210 may identify the one or more instances of conflicting information. An instance of conflicting information may refer to corresponding conflicting information (e.g., first conflicting information and second conflicting information) in multiple model files, multiple versions of model information, etc. For example, the corresponding conflicting information may describe different characteristics of a model element, different characteristics of a connection between model elements, different functions performed by a model element, etc. Each instance of conflicting information may include two or more conflicts corresponding to a particular portion of a model, a particular portion of a model file, and/or a particular portion of model information.

In some implementations, user device 210 may compare multiple model files (e.g., storing different versions of model information) to determine conflicting information and/or common information stored in the multiple files. For example, user device 210 may parse the multiple files to determine conflicting information and/or common information in the multiple files. User device 210 may compare the model information stored in the multiple files, may designate corresponding information that is the same in the multiple files as common information, and may designate corresponding information that is different in the multiple files as conflicting information. User device 210 may determine multiple instances of conflicting information in the multiple files, and may designate corresponding conflicting information (e.g., first and second conflicting information) associated with a first instance, may designate corresponding conflicting information (e.g., third and fourth conflicting information) associated with a second instance, etc.

Additionally, or alternatively, user device 210 may compare model information stored in a single model file to determine conflicting information and/or common information. In some implementations, the model file may include a conflict marker that identifies conflicting information and/or common information. User device 210 may search the conflicted file for the conflict marker. The conflict marker may include a particular string of characters and/or multiple strings of characters that surround and/or identify a portion of information in a model file. User device 210 may identify conflicting information and/or common information by parsing and/or searching the model file for one or more conflict markers that identify the conflicting information and/or the common information. In some implementations, a text comparison application may insert the conflict markers into a file (e.g., a model file or another type of file).

For example, the model file may include the following representation of model information, associated with a single instance of conflicting information:

[Common information]
<<<<<<<
[First conflicting information]
=======
[Second conflicting information]
>>>>>>>
[Common information].

In the above example model file, [Common information] may represent information common to multiple versions of model information (e.g., stored in the model file), [First conflicting information] may represent information that is unique to a first version of the model information, and [Second conflicting information] may represent information that is unique to a second version of the model information. The conflict marker <<<<<<< may indicate an end of a portion of the model file that includes common information, and may indicate a start of a portion of the model file that includes first conflicting information. The conflict marker ======= may indicate an end of the portion of the model file that includes first conflicting information, and may indicate a start of a portion of the model file that includes second conflicting information. The conflict marker >>>>>>> may indicate an end of the portion of the model file that includes second conflicting information, and may indicate a start of a portion of the model file that includes other common information. In some implementations, additional conflict markers may be included in the model file to indicate portions of the model file that include other conflicting information, associated with the same instance or other instances of conflicting information. Other sequences of characters may alternatively be used for the conflict markers.

In some implementations, user device 210 and/or server device 230 may generate model file(s). For example, user device 210 may generate model file(s) based on conflicting user edits to model information. For example, a first user may open a shared model file (e.g., stored by server device 230 and shared by multiple user devices 210), and may edit the shared model file. Before the first user can save the edits (e.g., on server device 230), a second user may open and edit the shared model file. Both users may save (e.g., on server device 230) respective edits to the shared model file, and the edits may conflict. For example, the first user may edit element X of a model so that element X multiplies two inputs. The second user may edit element X of the model so that element X adds the two inputs. When server device 230 receives the conflicting edits, server device 230 may store the conflicting edits as multiple model files and/or multiple versions of model information (e.g., by storing an association between multiple model files, by marking up a model file using conflict markers, etc.).

As another example, a user may open a model file, and may edit model information in the model file. User device 210 may provide the user with an option to save the edited model information as a variant of the model, and to maintain the original (non-edited) model information as another variant of the model. For example, the original model information may specify that element X of the model multiplies two inputs. The user may edit the model information to specify that element X adds the two inputs. Rather than replacing the original model information with the edited model information, user device 210 may store the original model information and the edited model information as variants of the model.

As shown in FIG. 4, process 400 may include formatting the first conflicting information and the second conflicting information in a manner that designates the first conflicting information and the second conflicting information as variants of a model described by the model information (block 440). For example, user device 210 may format the first and second conflicting information using a format that permits the modeling application to read, process, and/or execute the first and second conflicting information, and/or to identify the first and second conflicting information as variants of a model. A variant (or model variant), as used herein, may refer to an alternative structure, description, and/or set of characteristics associated with a model element, a connection between model elements, a function performed by a model element, a parameter that affects a behavior of the model or a model element, etc. In some implementations, a user may select a variant to use in association with a model. Executing the model using a first variant may cause the model to behave in a different manner than executing the model using a second (e.g., different) variant.

In some implementations, the model information may be formatted using program code, and user device 210 may format the first and second conflicting information by generating program code based on the format of the model information. The generated program code may designate the first and second conflicting information as variants of a model described by the model information. For example, user device 210 may generate program code formatted according to the following example:

```
[Common program code]
ElementXmultiply = TCE.variant(condition1)
ElementXadd = TCE.variant(condition2)
[Common program code].
```

In the above example program code, [Common program code] may represent program code corresponding to the common information (e.g., common to multiple model files and/or multiple versions of model information). Further, the example program code ElementXmultiply=TCE.variant (condition1) may represent program code that designates a first variant (e.g., named ElementXmultiply) based on the first conflicting information. Similarly, the example program code ElementXadd=TCE.variant(condition2) may represent program code that designates a second variant (e.g., named ElementXadd) based on the second conflicting information. When user device 210 (e.g., TCE 220) designates ElementXmultiply as an active variant of a model (e.g., to be used during model execution), the model may behave according to condition1, and when user device 210 designates ElementXadd as the active variant, the model may behave according to condition2. Alternatively, if condition1 is met, user device 210 may designate ElementXmultiply as the active variant, and if condition2 is met, user device 210 may designate ElementXadd as the active variant.

As another example, user device 210 may generate program code formatted according to the following example:

```
[Common program code]
#if(condition1)
    ElementX = ElementXmultiply
#elseif(condition2)
    ElementX = ElementXadd
#endif
[Common program code].
```

In the above example program code, [Common program code] may represent program code corresponding to the common information. Further, the example program code #if (condition1); ElementX=ElementXmultiply may represent program code that designates a first variant (e.g., named ElementXmultiply) based on the first conflicting information. Similarly, the example program code #elseif(condition2); ElementX=ElementXadd may represent program code that designates a second variant (e.g., named ElementXadd) based on the second conflicting information. When user device 210 designates ElementXmultiply as the active variant, the model may behave according to condition1, and when user device 210 designates ElementXadd as the active variant, the model may behave according to condition2. Alternatively, if condition1 is met, user device 210 may designate ElementXmultiply as the active variant, and if condition2 is met, user device 210 may designate ElementXadd as the active variant.

Additionally, or alternatively, the model information may be formatted using a markup language (e.g., XML), and user device 210 may format the first and second conflicting information by using the markup language to designate the first and second conflicting information as variants. For example, user device 210 may format the first and second conflicting information, using a markup language, according to the following example:

```
[Common information]
<variants>
   <variant1>
      <name> ElementXmultiply </name>
      <condition> condition1 </condition>
   </variant1>
   <variant2>
      <name> ElementXadd </name>
      <condition> condition2 </condition>
   </variant2>
</variants>
[Common information].
```

In the above example formatted information, [Common information] may correspond to the common information. Further, the tags <variants> and </variants> may denote a start and an end of a portion of the model information that identifies the variants. The tags <variant1> and </variant1> may denote a start and an end of a portion of the model information that identifies a first variant based on the first conflicting information. The first variant may be named ElementXmultiply (e.g., as denoted by the tags <name> and </name>), and may be associated with condition1 (e.g., as denoted by the tags <condition> and </condition>). Similarly, the tags <variant2> and </variant2> may denote a start and an end of a portion of the model information that identifies a second variant based on the second conflicting information. The second variant may be named ElementXadd (e.g., as denoted by the tags <name> and </name>), and may be associated with condition2 (e.g., as denoted by the tags <condition> and </condition>).

As further shown in FIG. 4, process 400 may include providing the formatted first conflicting information and the formatted second conflicting information to the modeling application (block 450), and executing the model based on the first conflicting information or the second conflicting information (block 460). For example, user device 210 may provide the formatted first and second conflicting information, and/or the common information, to the modeling application (e.g., TCE 220). The modeling application may read, process, and/or execute the formatted first conflicting information, the formatted second conflicting information, and/or the common information. For example, the modeling application may read, process, and/or execute a first variant corresponding to the formatted first conflicting information or a second variant corresponding to the formatted second conflicting information.

In some implementations, the modeling application may provide the first variant and/or the second variant via a user interface. A user may select, via the user interface, information that identifies a variant (e.g., the first or second variant), and the modeling application may designate the selected variant as an active variant of a model. In some implementations, the information that identifies the variant may be provided in relation to a model element to which the variants correspond. Additionally, or alternatively, the information may be provided based on receiving a user request to execute the model. The modeling application may execute the model using the selected variant, and the selected variant may affect a behavior of the executed model.

Additionally, or alternatively, user device 210 may automatically select a variant to use as an active variant of the model (e.g., a variant to use when executing the model). For example, user device 210 may select a variant based on a date associated with the variant and/or conflicting information corresponding to the variant (e.g., a date and/or time the variant/conflicting information was created, modified, stored, etc.), a size of the variant and/or the conflicting information (e.g., an amount of memory space required to store the variant/conflicting information), an author of the variant and/or the conflicting information, a user-indicated preference for a particular variant and/or conflicting information, a behavior of a user in relation to the variant (e.g., an indication that a user selected a particular variant in the past), a behavior of other users in relation to the variant (e.g., an indication that other users typically select a particular variant, such as other users sharing the modeling application or the model), etc.

In some implementations, the modeling application may perform multiple executions of the model, with each execution using a different variant as the active variant of the model. For example, the modeling application may execute the model using the first variant, and may also execute the model using the second variant (e.g., using serial or parallel execution). The modeling application may provide information associated with the multiple executions (e.g., a result of each execution, information associated with each variant, etc.). Additionally, or alternatively, the modeling application may determine a variant to designate as the active variant based on the multiple executions (e.g., based on which variant provided the best result according to a user preference associated with the results).

User device 210 may alternatively determine, format, and/or provide additional conflicting information, such as third conflicting information, fourth conflicting information, fifth conflicting information, etc., in a manner similar to that described above with respect to the first conflicting information and the second conflicting information.

While a series of blocks has been described with regard to FIG. 4, the blocks and/or the order of the blocks may be modified in some implementations. Additionally, or alternatively, non-dependent blocks may be performed in parallel.

Figure 5A:
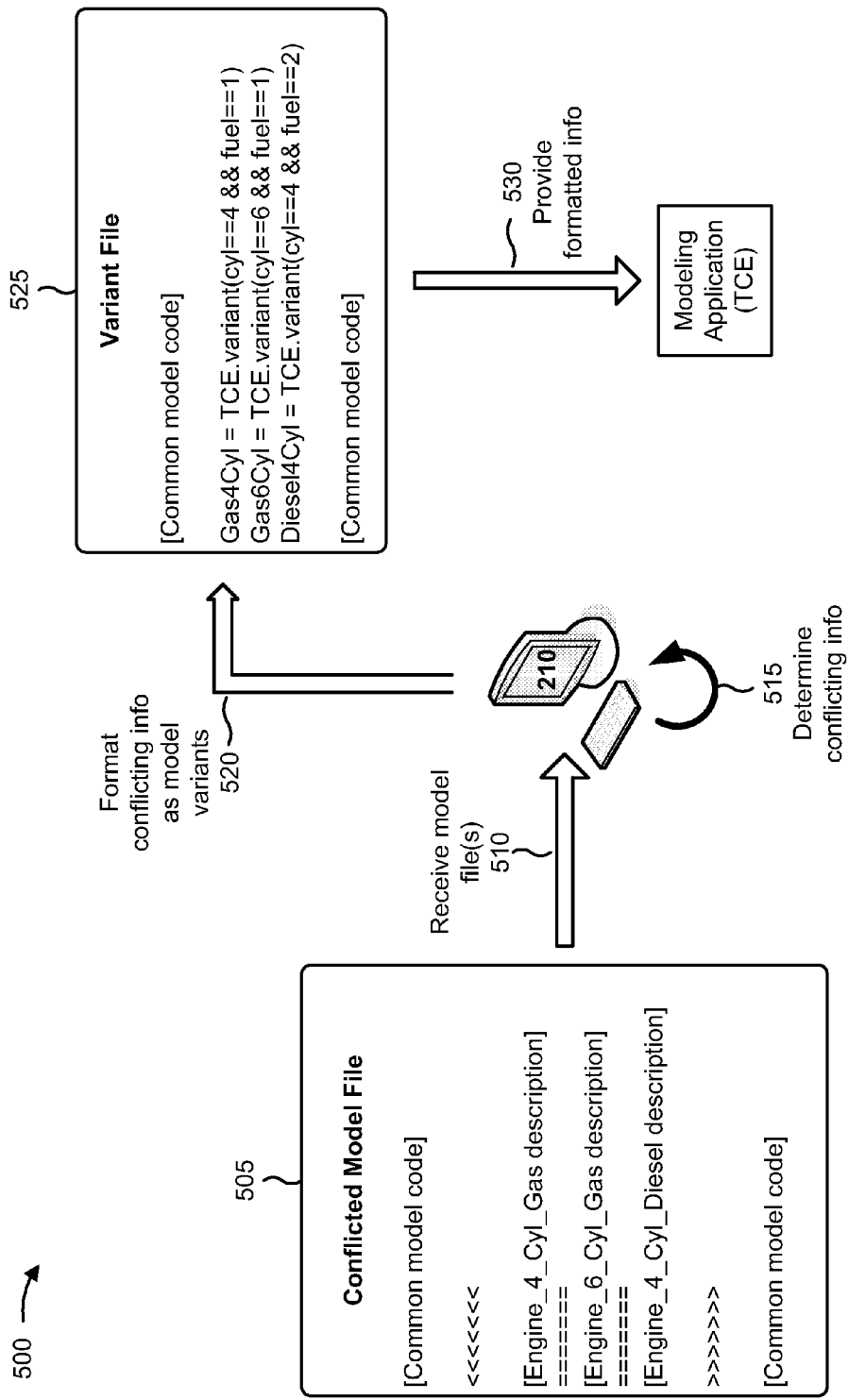
FIGS. 5A-5D are diagrams of an example implementation relating to the example process shown in FIG. 4.
Figure 5B:
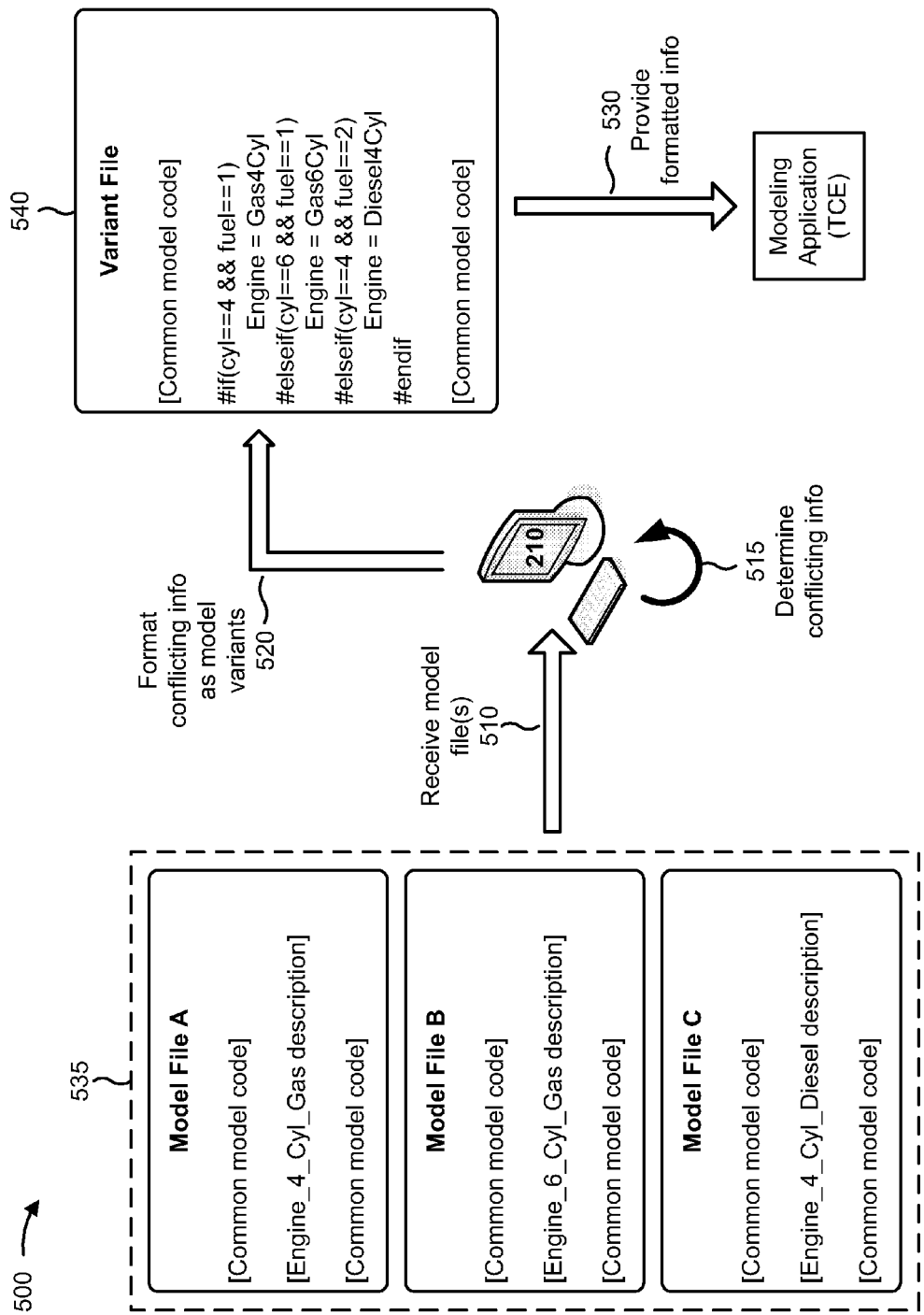
Figure 5C:
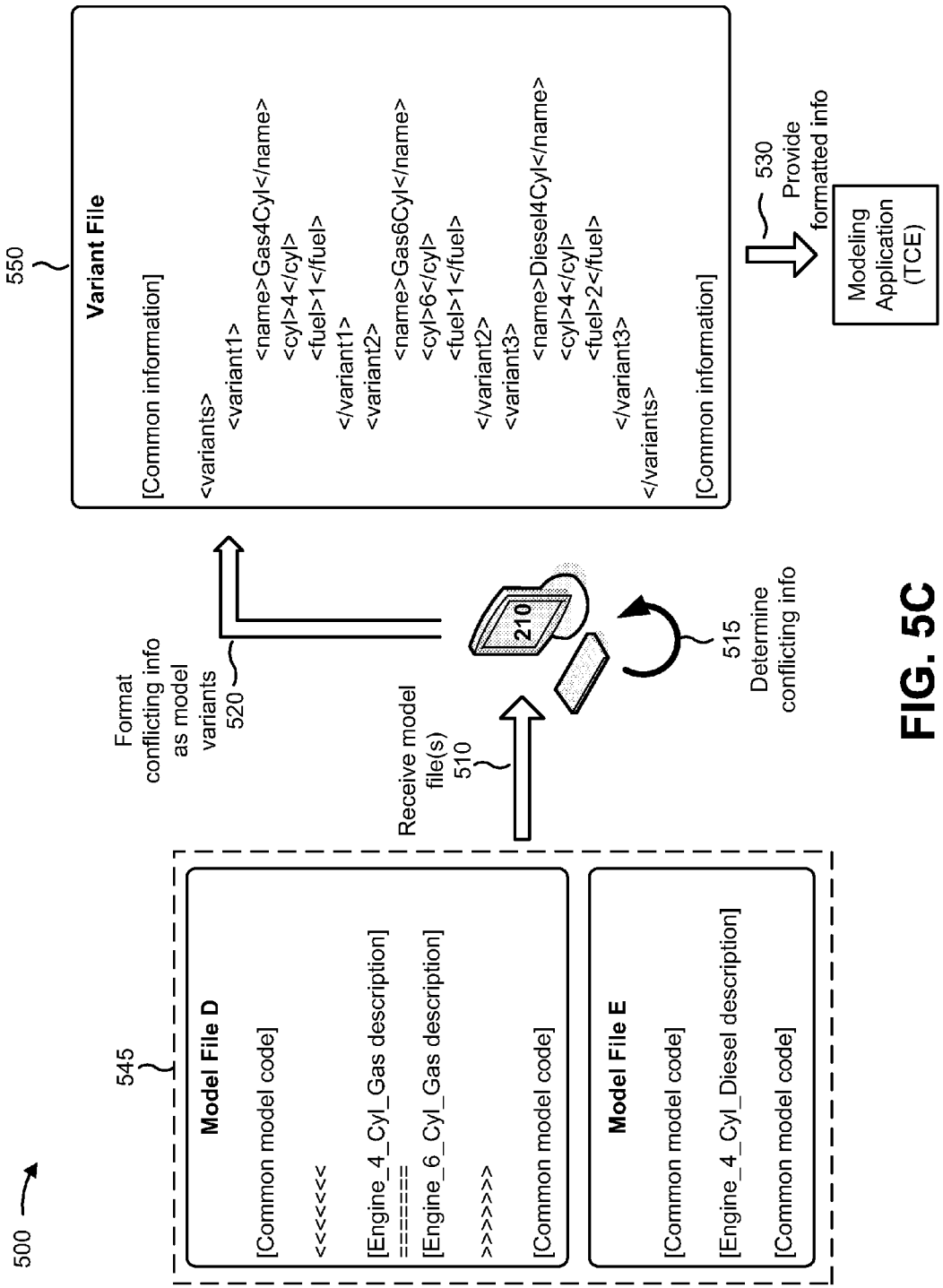
Figure 5D:
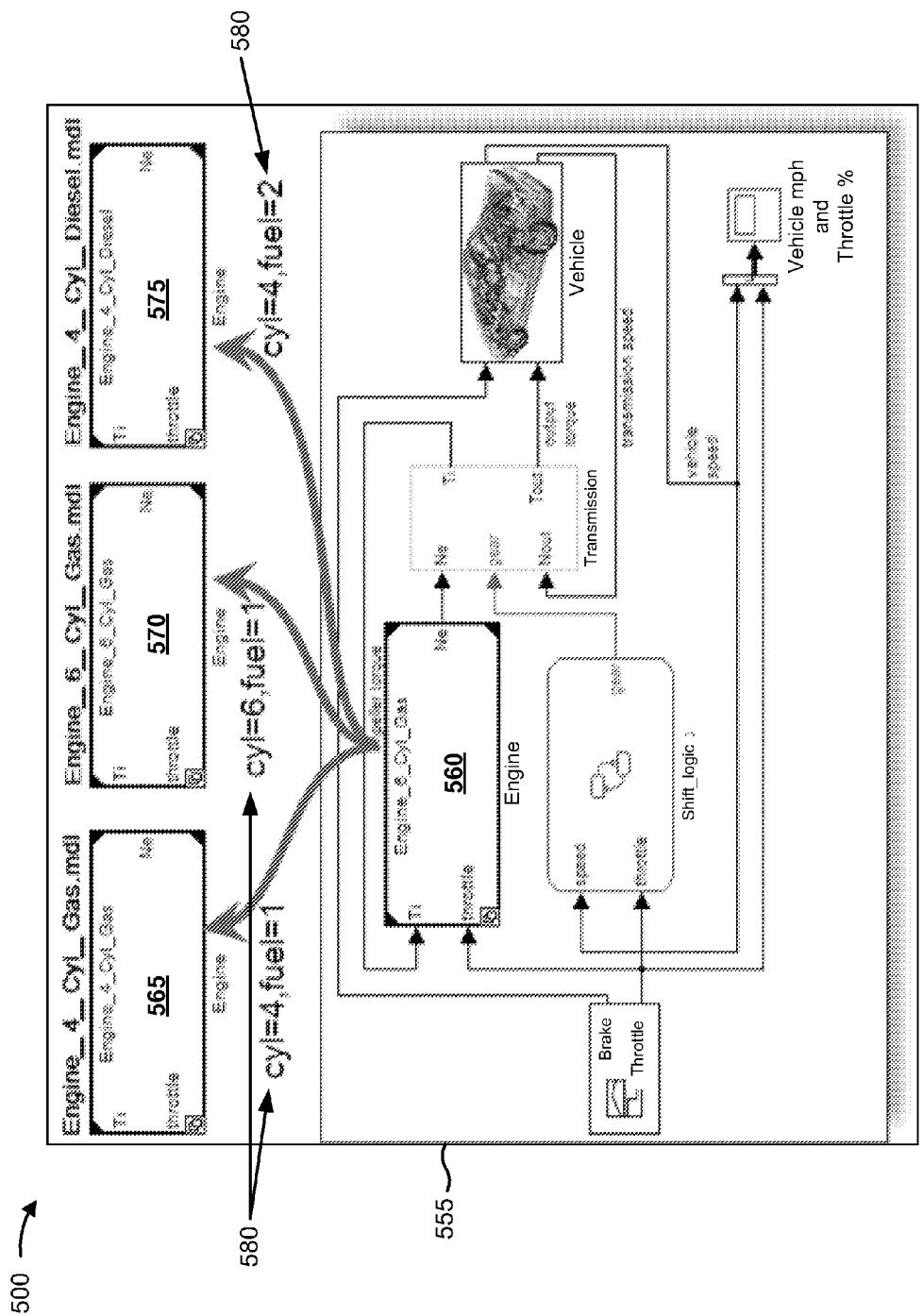

FIGS. 5A-5D are diagrams of example implementations 500 relating to example process 400 (FIG. 4). FIGS. 5A-5C show different examples of generating a variant file, that includes formatted conflicting information, from one or more model files that include model information. FIG. 5D shows an example implementation of a modeling application using the variant file.

In FIG. 5A, assume that server device 230 has generated conflicted model file 505, based on conflicting user edits to a model file. Conflicted model file 505 may include information, such as program code, that describes a model of a system, such as a vehicle. Conflicted model file 505 may further include conflicting information that corresponds to alternative descriptions of the model. Each alternative description may represent a different possible subsystem of the system (e.g., an element of the model), such as an engine used in the vehicle. As shown, conflicted model file 505 may include the following representation of model information:

```
[Common model code]
<<<<<<<
[Engine_4_Cyl_Gas description]
=======
[Engine_6_Cyl_Gas description]
=======
[Engine_4_Cyl_Diesel description]
>>>>>>>
[Common model code].
```

In conflicted model file 505, [Common model code] may represent program code that describes model elements other than the element(s) modeled by the alternative descriptions (e.g., non-alternative model elements, such as non-alternative portions of the model and/or the model information). For example, [Common model code] may represent a vehicle transmission, a vehicle accelerator, a vehicle brake, and/or another vehicle component. In conflicted model file 505, each of [Engine_4_Cyl_Gas description], [Engine_6_Cyl_Gas description], and [Engine_4_Cyl_Diesel description] may represent program code that describes an alternative description of an element of the model, such as an engine. For example, [Engine_4_Cyl_Gas description] may represent program code that describes a four cylinder gas engine, [Engine_6_Cyl_Gas description] may represent program code that describes a six cylinder gas engine, and [Engine_4_Cyl_Diesel description] may represent program code that describes a four cylinder diesel engine. In conflicted model file 505, <<<<<<<, ======= and >>>>>>> may represent conflict markers that identify and/or differentiate between the common model code and the conflicting information corresponding to the model variants.

As shown by reference number 510, user device 210 may receive conflicted model file 505 (e.g., from server device 230). As shown by reference number 515, user device 210 may parse conflicted model file 505 to determine conflicting information, corresponding to alternative descriptions of model elements, included in conflicted model file 505. As shown by reference number 520, user device 210 may format the conflicting information as model variants. For example, user device 210 may generate variant file 525 that includes the formatted conflicting information. As shown, variant file 525 may include the following representation of formatted conflicting information:

```
[Common model code]
Gas4Cyl = TCE.variant(cyl==4 && fuel==1)
Gas6Cyl = TCE.variant(cyl==6 && fuel==1)
Diesel4Cyl = TCE.variant(cyl==4 && fuel==2)
[Common model code].
```

In variant file 525, [Common model code] may represent program code that describes model elements other than the element(s) modeled by the variants. Further, Gas4Cyl, Gas6Cyl, and Diesel4Cyl may represent respective names of the variants associated with a four cylinder gas engine, a six cylinder gas engine, and a four cylinder diesel engine. The arguments (cyl==4&&fuel==1), (cyl==6&&fuel==1), and (cyl==4&&fuel==2) may represent respective conditions or characteristics associated with the variants Gas4Cyl, Gas6Cyl, and Diesel4Cyl.

In some implementations, the conditions and/or characteristics may be described in the alternative descriptions in the model information. User device 210 may determine discrepancies between the alternative descriptions, such as discrepancies between variables (e.g., different values for the same variable, different variables, etc.), parameters (e.g., different parameter values for the same parameter, different parameters, etc.), or other model information. Based on determining the discrepancies, user device 210 may create variants that include, for example, different variable or parameter values, and may create conditions or characteristics associated with each variant, using the different variable or parameter values.

As shown by reference number 530, user device 210 may provide variant file 525, the information in variant file 525, and/or the formatted conflicting information to a modeling application (e.g., TCE 220). The modeling application may recognize Gas4Cyl, Gas6Cyl, and Diesel4Cyl as variants of a model of a vehicle, based on the format of variant file 525.

In FIG. 5B, assume that user device 210 and/or server device 230 stores model files 535, which include Model File A, Model File B, and Model File C. Model files 535 may include information, such as program code, that describes a model of a system (e.g., as described with above with respect to FIG. 5A). Each of Model File A, Model File B, and Model File C may include conflicting information that corresponds to alternative descriptions of the model. As shown, Model File A may include the following representation of model information:

```
[Common model code]
[Engine_4_Cyl_Gas description]
[Common model code].
```

In Model File A, [Common model code] may represent program code that is the same in Model File A, Model File B, and Model File C, and that describes non-alternative model elements (e.g., a cruise control, a climate control, etc.). Further, [Engine_4_Cyl_Gas description] may represent program code that describes an alternative description (e.g., a four cylinder gas engine) of an element (e.g., an engine) of a model described in Model Files A, B, and C.

As further shown, Model File B may include the following representation of model information:

```
[Common model code]
[Engine_6_Cyl_Gas description]
[Common model code].
```

In Model File B, [Common model code] may represent program code that is the same in Model File A, Model File B, and Model File C, and that describes non-alternative model elements. Further, [Engine_6_Cyl_Gas description] may represent program code that describes an alternative description (e.g., a six cylinder gas engine) of an element (e.g., an engine) of a model described in Model Files A, B, and C.

As further shown, Model File C may include the following representation of model information:

```
[Common model code]
[Engine_4_Cyl_Diesel description]
[Common model code].
```

In Model File C, [Common model code] may represent program code that is the same in Model File A, Model File B, and Model File C, and that describes non-alternative model elements. Further, [Engine_4_Cyl_Diesel description] may represent program code that describes an alternative description (e.g., a four cylinder diesel engine) of an element (e.g., an engine) of a model described in Model Files A, B, and C.

As shown by reference number 510, user device 210 may receive model files 535 (e.g., from server device 230 and/or retrieved from a memory of user device 210). As shown by reference number 515, user device 210 may parse model files 535 to determine conflicting information, corresponding to model alternatives, included in model files 535. As shown by reference number 520, user device 210 may format the conflicting information as model variants. For example, user device 210 may generate variant file 540 that includes the formatted conflicting information. As shown, variant file 540 may include the following representation of formatted conflicting information:

```
[Common model code]
#if(cyl==4 && fuel==1)
    Engine = Gas4Cyl
#elseif(cyl==6 && fuel==1)
    Engine = Gas6Cyl
#elseif(cyl==4 && fuel==2)
    Engine = Diesel4Cyl
#endif
[Common model code].
```

In variant file 540, [Common model code] may represent program code that describes model elements other than the element(s) modeled by the variants. Further, Gas4Cyl, Gas6Cyl, and Diesel4Cyl may represent respective names of the variants associated with a four cylinder gas engine, a six cylinder gas engine, and a four cylinder diesel engine, of a model element named Engine. The arguments (cyl==4&&fuel==1), (cyl==6&&fuel==1), and (cyl==4&&fuel==2) may represent respective conditions or characteristics associated with the variants Gas4Cyl, Gas6Cyl, and Diesel4Cyl.

As shown by reference number 530, user device 210 may provide variant file 540, the information in variant file 540, and/or the formatted conflicting information to a modeling application (e.g., TCE 220). The modeling application may recognize Gas4Cyl, Gas6Cyl, and Diesel4Cyl as variants of a model of a vehicle, based on the format of variant file 540.

In FIG. 5C, assume that user device 210 and/or server device 230 stores model files 545, which include Model File D and Model File E. Model files 545 may include information, such as program code, that describes a model of a system (e.g., as described with above with respect to FIG. 5A). Each of Model File D and Model File E may include conflicting information that corresponds to alternative descriptions of the model. As shown, Model File D may include the following representation of model information:

```
[Common model code]
<<<<<<<
[Engine_4_Cyl_Gas description]
=======
[Engine_6_Cyl_Gas description]
>>>>>>>
[Common model code].
```

In Model File D, [Common model code] may represent program code that is the same in Model File D and Model File E, and that describes non-alternative model elements. Further, [Engine_4_Cyl_Gas description] and [Engine_6_Cyl_Gas description] may represent program code that describes respective alternative descriptions (e.g., a four cylinder gas engine and a six cylinder gas engine, respectively) of an element (e.g., an engine) of a model described in Model Files D and E. In Model File D, <<<<<<<, =======, and >>>>>>> may represent conflict markers that identify and/or differentiate between the common model code and the conflicting information corresponding to the alternative descriptions of the model.

As further shown, Model File E may include the following representation of model information:

```
[Common model code]
[Engine_4_Cyl_Diesel description]
[Common model code].
```

In Model File E, [Common model code] may represent program code that is the same in Model File D and Model File E, and that describes non-alternative model elements. Further, [Engine_4_Cyl_Diesel description] may represent program code that describes an alternative description (e.g., a four cylinder diesel engine) of an element (e.g., an engine) of a model described in Model Files D and E.

As shown by reference number 510, user device 210 may receive model files 545 (e.g., from server device 230 and/or retrieved from a memory of user device 210). As shown by reference number 515, user device 210 may parse model files 545 to determine conflicting information, corresponding to alternative model descriptions, included in model files 545. As shown by reference number 520, user device 210 may format the conflicting information as model variants. For example, user device 210 may generate variant file 550 that includes the formatted conflicting information. As shown, variant file 550 may include the following representation of formatted conflicting information:

```
[Common information]
<variants>
    <variant1>
        <name> Gas4Cyl </name>
        <cyl> 4 </cyl>
        <fuel> 1 </fuel>
    </variant1>
    <variant2>
        <name> Gas6Cyl </name>
        <cyl> 6 </cyl>
        <fuel> 1 </fuel>
    </variant2>
    <variant3>
        <name> Diesel4Cyl </name>
        <cyl> 4 </cyl>
        <fuel> 2 </fuel>
    </variant3>
</variants>
[Common information].
```

In variant file 550, [Common information] may represent model information that describes non-variant model elements. Further, the tags <variants> and </variants> may denote a start and an end of a portion of the model information that identifies the variants. The tags <variant1> and </variant1> may denote a start and an end of a portion of the model information that identifies a first variant based on first conflicting information. The first variant may be named Gas4Cyl (e.g., as denoted by the tags <name> and </name>), and may be associated with a cylinder characteristic of 4 (e.g., as denoted by the tags <cyl> and </cyl>) and a fuel characteristic of 1 (e.g., as denoted by the tags <fuel> and </fuel>).

Similarly, the tags <variant2> and </variant2> may denote a start and an end of a portion of the model information that identifies a second variant based on second conflicting information. The second variant may be named Gas6Cyl, and may be associated with a cylinder characteristic of 6 and a fuel characteristic of 1. Finally, the tags <variant3> and </variant3> may denote a start and an end of a portion of the model information that identifies a third variant based on third conflicting information. The third variant may be named Diesel4Cyl, and may be associated with a cylinder characteristic of 4 and a fuel characteristic of 2.

As shown by reference number 530, user device 210 may provide variant file 550, the information in variant file 550, and/or the formatted conflicting information to a modeling application (e.g., TCE 220). The modeling application may recognize Gas4Cyl, Gas6Cyl, and Diesel4Cyl as variants of a model of a vehicle, based on the format of variant file 550.

As shown in FIG. 5D, user device 210 (e.g., TCE 220 and/or the modeling application) may provide a user interface 555 of a model that includes various elements (e.g., subsystems), such as a model of various elements of a vehicle, including a brake, a throttle, an engine, a transmission, shift logic, etc. One or more of the elements may include multiple variants. As shown, engine element 560 includes three variants, labeled 565, 570, and 575.

In FIG. 5D, assume that the modeling application has received any one of variant file 525 (FIG. 5A), variant file 540 (FIG. 5B), or variant file 550 (FIG. 5C). These variant files identify three alternative variants for engine element 560: a four cylinder gas engine, a six cylinder gas engine, and a four cylinder diesel engine. As shown in FIG. 5D, the modeling application may provide a representation of these variants via user interface 555. For example, reference number 565 shows a representation of the four cylinder gas engine variant (e.g., Engine_4_Cyl_Gas), reference number 570 shows a representation of the six cylinder gas engine variant (e.g., Engine_6_Cyl_Gas), and reference number 575 shows a representation of the four cylinder diesel engine variant (e.g., Engine_4_Cyl_Diesel). As shown by reference number 580, the modeling application may also provide, via user interface 555, a representation of the conditions or characteristics associated with the variants.

In some implementations, a user may select, via user interface 555, a variant (e.g., variant 565, variant 570, or variant 575) to be used as engine element 560. When the modeling application executes the model, the behavior of engine element 560 may be determined by the selected variant (e.g., conditions and/or characteristics associated with the selected variant).

Figure 6A:
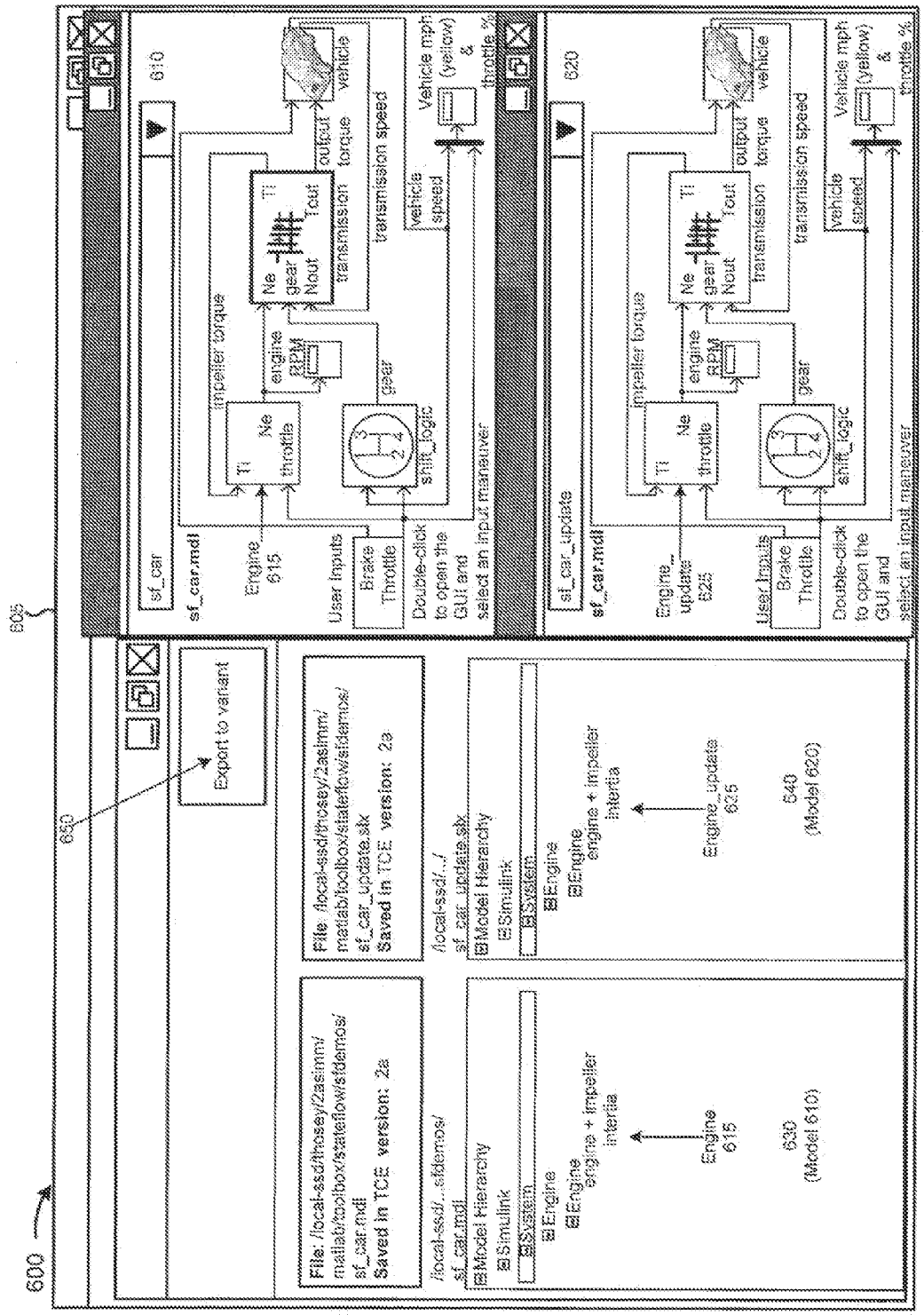
FIGS. 6A and 6B are diagrams of another example implementation relating to the example process shown in FIG. 4.
Figure 6B:
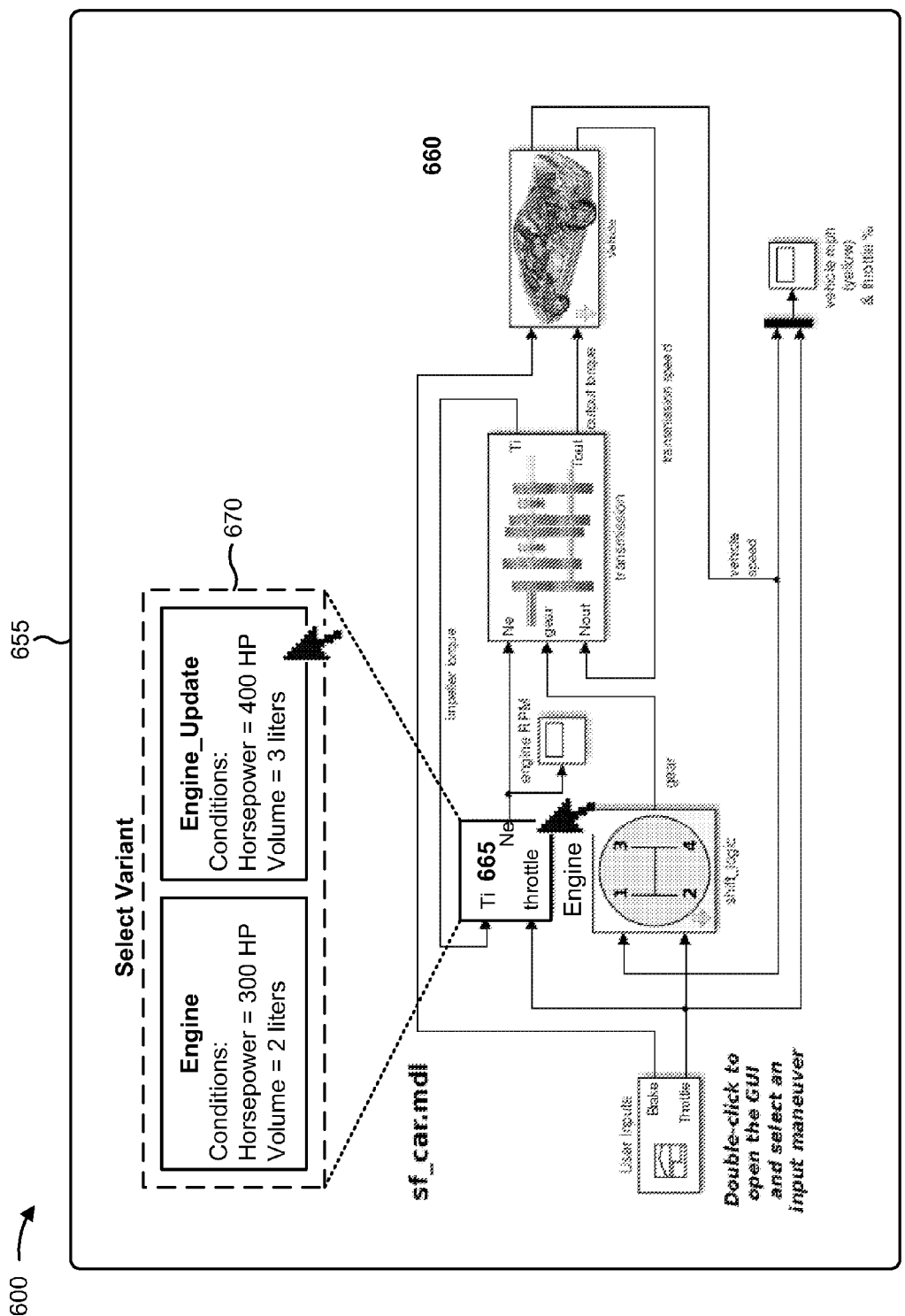

FIGS. 6A and 6B are diagrams of another example implementation 600 relating to example process 400 (FIG. 4). Implementation 600 shows an example where a user saves an edit to a model as a model variant.

As shown in FIG. 6A, user device 210 (e.g., TCE 220 and/or the modeling application) may provide a user interface 605 that permits a user to view, edit, execute, save, etc. a model. In FIG. 6A, assume that a modeling application has loaded a model file that causes a first model 610, of a vehicle that includes an engine element 615, to be displayed. Further assume that a user has edited a characteristic associated with engine element 615, to generate a second model 620 of a vehicle that includes an engine_update element 625. Alternatively, assume that the modeling application has loaded first model 610 with engine element 615, and has also loaded second model 620 with engine_update element 625.

The modeling application may compare the models (e.g., models 610 and 620), and may provide a representation of the differences between the models. For example, a user interface portion 630 may provide a representation of an element of model 610 (e.g., engine element 615). Similarly, a user interface portion 640 may provide a representation of a corresponding element of model 620 (e.g., engine_update element 625). User interface portion 630 and/or 640 may provide information that identifies differences between the corresponding elements, such as differing characteristics of elements 615 and 625. The modeling application may provide an input mechanism 650 for a user to store the different corresponding elements as variants of a model. For example, user selection of input mechanism 650 ("Export to variant") may cause user device 210 to store engine element 615 and engine_update element 625 as variants of an element of a model (e.g., using a format as shown in variant files 525, 540, or 550 in FIGS. 5A-5C).

As shown in FIG. 6B, the modeling application may provide a user interface 655 (which may correspond to user interface 605, in some implementations) that provides a model 660, which may correspond to model 610 and/or model 620. The modeling application may further provide an input mechanism for a user to select a model element, such as engine element 665. In some implementations, the modeling application may display an input mechanism 670 based on user interaction with engine element 665. Input mechanism 670 may provide a mechanism for a user to select a variant to use for engine element 665. For example, the user may select the "Engine" variant, which may cause an engine with 300 horsepower and a volume of two liters to be included in model 660 (e.g., as engine element 665). Alternatively, the user may select the "Engine_update" variant, which may cause an engine with 400 horsepower and a volume of three liters to be included in model 660 (e.g., as engine element 665).

Additionally, or alternatively, the modeling application may provide input mechanism 670 when the model is executed. For example, the user may input, via user interface 655, a request to execute the model. Based on receiving the request, the modeling application may provide input mechanism 670, and may receive user selection of a variant to use for engine element 665. Additionally, or alternatively, the modeling application may provide an indication that a particular variant (e.g., the most recently updated variant, such as "Engine_update") will be used to execute the model, and may receive user input to approve the use of the particular variant or to select a different variant to use during model execution.

The foregoing disclosure provides illustration and description, but is not intended to be exhaustive or to limit the implementations to the precise form disclosed. Modifications and variations are possible in light of the above disclosure or may be acquired from practice of the implementations.

Some implementations have been described herein with respect to model information and model variants. The techniques described herein are not limited to models, and may be applied to any information and/or data that may include variants, such as variants identified by conflicting information. For example, the techniques described herein with respect to model information may alternatively be applied to application information (e.g., information associated with an application). Additionally, the techniques described herein with respect to variants of a model may alternatively be applied to variants of items described by the application information.

As used herein, component is intended to be broadly construed as hardware, firmware, or a combination of hardware and software.

As used herein, program code is to be broadly interpreted to include text-based code that may not require further processing to execute (e.g., C++ code, Hardware Description Language (HDL) code, very-high-speed integrated circuits (VHSIC) HDL (VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables (e.g., Python text files, a collection of dynamic-link library (DLL) files with text-based combining, configuration information that connects pre-compiled modules, an extensible markup language (XML) file describing module linkage, etc.); etc. In one example, program code may include different combinations of the above-identified classes (e.g., text-based code, binary code, text files, etc.). Additionally, or alternatively, program code may include code generated using a dynamically-typed programming language (e.g., the M language, a MATLAB® language, a MATLAB-compatible language, a MATLAB-like language, etc.) that can be used to express problems and/or solutions in mathematical notations. Additionally, or alternatively, program code may be of any type, such as a function, a script, an object, etc., and a portion of program code may include one or more characters, lines, etc. of the program code.

It will be apparent that systems and/or methods, as described herein, may be implemented in many different forms of software, firmware, and hardware in the implementations illustrated in the figures. The actual software code or specialized control hardware used to implement these systems and/or methods is not limiting of the implementations. Thus, the operation and behavior of the systems and/or methods were described without reference to the specific software code—it being understood that software and control hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A device, comprising:
    one or more processors to:
        receive model information associated with a modeling application;
        determine first conflicting information and second conflicting information in the model information,
            the first conflicting information and the second conflicting information describing different characteristics of a model described by the model information;
        format the first conflicting information and the second conflicting information in a manner that designates the first conflicting information as a first variant of the model and that designates the second conflicting information as a second variant of the model,
            the model, when executed with the first variant, behaving in a different manner than when executed with the second variant;
        provide the formatted first conflicting information and the formatted second conflicting information to the modeling application;
        provide, via a user interface and based on providing the formatted first and second conflicting information, information that identifies the first variant and information that identifies the second variant;
        receive a user selection of information that identifies one of the first variant or the second variant; and
        execute the model based on the user selection.

2. The device of claim 1, where the one or more processors are further to:
    receive a request to execute the model; and
    provide the information that identifies the first variant and the information that identifies the second variant based on receiving the request to execute the model.

3. The device of claim 1,
    where the model information is stored in a plurality of files; and
    where the one or more processors, when determining the first conflicting information and the second conflicting information, are further to:
        compare, based on receiving the model information, the model information stored in the plurality of files;
        identify the first conflicting information, in a first file of the plurality of files, based on comparing the model information; and
        identify the second conflicting information, in a second file of the plurality of files, based on comparing the model information.

4. The device of claim 1,
    where the model information is stored in a single file; and
    where the one or more processors, when determining the first conflicting information and the second conflicting information, are further to:
        identify, based on receiving the model information, a conflict marker in the single file,
            the conflict marker identifying an instance of conflicting information;
        identify the first conflicting information, in the single file, based on the conflict marker; and
        identify the second conflicting information, in the single file, based on the conflict marker.

5. The device of claim 1, where the first conflicting information and the second conflicting information describe at least one of:
    different characteristics of an element of the model;
    different characteristics of a connection between elements of the model;
    different functions performed by an element of the model; or
    different parameters that affect a behavior of the model.

6. The device of claim 1, where the one or more processors, when formatting the first conflicting information and the second conflicting information, are further to:
    format the first conflicting information and the second conflicting information based on at least one of:
        a program code;
        a data structure;
        a markup language;
        a file format; or
        a format that permits the modeling application to read, process, or execute the first conflicting information and the second conflicting information.

7. The device of claim 1, where the one or more processors are further to:
   determine common information in the model information,
      the common information describing non-variant portions of the model; and
   provide the common information to the modeling application.

8. A non-transitory computer-readable medium storing instructions, the instructions comprising:
   one or more instructions that, when executed by a processor, cause the processor to:
      receive application information associated with an application;
      determine first conflicting information and second conflicting information included in the application information,
         the first conflicting information and the second conflicting information describing different characteristics of an item described by the application information;
      format the first conflicting information and the second conflicting information in a manner that designates the first conflicting information as a first variant of the item and that designates the second conflicting information as a second variant of the item,
         the item, when associated with the first variant, having different characteristics than when associated with the second variant;
      provide the formatted first conflicting information and the formatted second conflicting information to the application;
      receive an indication that one of the formatted first conflicting information or the formatted second conflicting information is to be executed by the application; and
      execute the application information and one of the formatted first conflicting information or the formatted second conflicting information, based on the received indication.

9. The non-transitory computer-readable medium of claim 8,
   where the application information is stored in a plurality of files; and
   where the one or more instructions, that cause the processor to determine the first conflicting information and the second conflicting information, further cause the processor to:
      compare, based on receiving the application information, the application information stored in the plurality of files;
      identify the first conflicting information, in a first file of the plurality of files, based on comparing the application information; and
      identify the second conflicting information, in a second file of the plurality of files, based on comparing the application information.

10. The non-transitory computer-readable medium of claim 8,
   where the application information is stored in a single file; and
   where the one or more instructions, that cause the processor to determine the first conflicting information and the second conflicting information, further cause the processor to:
      identify, based on receiving the application information, a conflict marker in the single file,
         the conflict marker identifying an instance of conflicting information;
      identify the first conflicting information, in the single file, based on the conflict marker; and
      identify the second conflicting information, in the single file, based on the conflict marker.

11. The non-transitory computer-readable medium of claim 8, where the first conflicting information and the second conflicting information describe at least one of:
   different characteristics of a connection between items described by the application information;
   different functions performed by an item described by the application information; or
   different parameters that affect a behavior of the application information, when execute by the application.

12. The non-transitory computer-readable medium of claim 8, where the one or more instructions, that cause the processor to format the first conflicting information and the second conflicting information, further cause the processor to:
   format the first conflicting information and the second conflicting information based on at least one of:
      a program code;
      a data structure;
      a markup language;
      a file format; or
      a format that permits the application to read, process, or execute the first conflicting information or the second conflicting information.

13. The non-transitory computer-readable medium of claim 8, where the one or more instructions further cause the processor to:
   determine common information in the application information,
      the common information describing non-variant portions of the application information, and
   provide the common information to the application.

14. A method, comprising:
   receiving model information that describes a model,
      the receiving the model information being performed by a device;
   determining first conflicting information and second conflicting information in the model information,
      the first conflicting information and the second conflicting information describing different characteristics of the model, and
      the determining being performed by the device;
   generating formatted information that identifies the first conflicting information as a first variant of the model and that identifies the second conflicting information as a second variant of the model,
      the first variant and the second variant affecting a manner in which the model behaves when executed,
      the first variant being different from the second variant, and
      the generating being performed by the device;
   designating one of the first variant or the second variant as an active variant of the model,
      the designating being performed by the device; and
   executing the model based on the designated active variant and the formatted information,
      the executing being performed by the device.

15. The method of claim 14,
   where the model information is arranged in a particular format; and
   where generating the formatted information further comprises:
      generating the formatted information based on the particular format.

16. The method of claim 15, where the particular format is based on at least one of:
   a program code;
   a data structure;
   a markup language;

a file format; or a format that permits a modeling application, associated with the model information, to read, process, or execute the first conflicting information or the second conflicting information.

17. The method of claim 14,
where the model information is stored in a plurality of files; and
where determining the first conflicting information and the second conflicting information further comprises:
   comparing, based on receiving the model information, the model information stored in the plurality of files;
   identifying the first conflicting information, in a first file of the plurality of files, based on comparing the model information; and
   identifying the second conflicting information, in a second file of the plurality of files, based on comparing the model information.

18. The method of claim 14,
where the model information is stored in a single file; and
where determining the first conflicting information and the second conflicting information further comprises:
identifying, based on receiving the model information, a conflict marker in the single file,
   the conflict marker identifying an instance of conflicting information;
   identifying the first conflicting information, in the single file, based on the conflict marker; and
   identifying the second conflicting information, in the single file, based on the conflict marker.

19. The method of claim 14, where the first conflicting information and the second conflicting information describe at least one of:
   different characteristics of an element of the model;
   different characteristics of a connection between elements of the model;
   different functions performed by an element of the model; or
   different parameters that affect a behavior of the model.

20. The method of claim 14, where designating the one of the first variant or the second variant as the active variant is based on at least one of:
   a user selection of the first variant or the second variant;
   a date or time associated with the first variant or the second variant;
   a size associated with the first variant or the second variant;
   a user associated with the first variant or the second variant; or
   a result of executing the model using the first variant or the second variant.

* * * * *

UNITED STATES PATENT AND TRADEMARK OFFICE
CERTIFICATE OF CORRECTION

| | | |
|---|---|---|
| PATENT NO. | : 8,924,193 B2 | Page 1 of 1 |
| APPLICATION NO. | : 13/828312 | |
| DATED | : December 30, 2014 | |
| INVENTOR(S) | : Timothy Hosey et al. | |

It is certified that error appears in the above-identified patent and that said Letters Patent is hereby corrected as shown below:

In the Claims

Claim 11

Column 20, line 11, change "execute" to -- executed --.

Claim 13

Column 20, line 31, after "application information" change "," to -- ; --.

Signed and Sealed this
Twenty-eighth Day of July, 2015

Michelle K. Lee
*Director of the United States Patent and Trademark Office*